United States Patent
Cho et al.

(10) Patent No.: US 6,906,845 B2
(45) Date of Patent: Jun. 14, 2005

(54) MICRO-MECHANICAL DEVICE HAVING ANTI-STICTION LAYER AND METHOD OF MANUFACTURING THE DEVICE

(75) Inventors: Chang-ho Cho, Suwon (KR); Hyung-jae Shin, Seongnam (KR); Woon-bae Kim, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 10/690,537

(22) Filed: Oct. 23, 2003

(65) Prior Publication Data

US 2004/0136049 A1 Jul. 15, 2004

Related U.S. Application Data

(63) Continuation-in-part of application No. 10/151,011, filed on May 21, 2002, now abandoned.

(30) Foreign Application Priority Data

Nov. 26, 2001 (KR) .......................................... 2001-73733

(51) Int. Cl.[7] .......................... G02B 26/00; G02B 26/08

(52) U.S. Cl. ..................... 359/290; 359/291; 359/292; 359/295; 427/162

(58) Field of Search ................................ 359/290–292, 359/295, 298, 224, 230; 427/534, 162; 438/24, 50, 519, 591

(56) References Cited

U.S. PATENT DOCUMENTS

| | | | |
|---|---|---|---|
| 5,285,196 A | | 2/1994 | Gale, Jr. |
| 5,512,374 A | * | 4/1996 | Wallace et al. ............. 428/422 |
| 5,616,372 A | | 4/1997 | Conley et al. |
| 5,661,592 A | * | 8/1997 | Bornstein et al. ........... 359/291 |
| 5,694,740 A | | 12/1997 | Martin et al. |
| 6,051,503 A | | 4/2000 | Bhardwaj et al. |

* cited by examiner

Primary Examiner—Hung Xuan Dang
Assistant Examiner—Joseph Martinez
(74) Attorney, Agent, or Firm—Sughrue Mion, PLLC

(57) ABSTRACT

The micro-mechanical structure includes an anti-stiction layer formed by plasma enhanced chemical vapor deposition and plasma etching. The anti-stiction layer is selectively formed on only the area of a substrate other than the top of a movable structure and a part of an electrode that is subsequently bonded to a wire.

8 Claims, 8 Drawing Sheets

MICRO-MECHANICAL DEVICE HAVING ANTI-STICTION LAYER AND METHOD OF MANUFACTURING THE DEVICE

This is a Continuation-In-Part of application Ser. No. 10/151,011 filed May 21, 2002 now abandoned, the disclosure of which is incorporated herein by reference in its entirety.

BACKGROUND OF THE INVENTION

This application is based on Korean Patent Application No. 2001-73733 filed on Nov. 26, 2001, the disclosure of which is incorporated herein by reference in its entirety.

1. Field of the Invention

The present invention relates in general to a micro-mechanical device, and more particularly to a micro-mechanical device having an anti-stiction layer and a method of manufacturing the device.

2. Description of the Related Art

Recently, many different types of micro-mechanical devices such as micro-motors, micro-gears, and micro-mirror devices have been developed. In micro-mirror devices, according to resolution, for example, 500,000 through 1,200,000 actuating micro aluminum mirrors having a size of 13–16 microns are disposed at intervals of 1 micron. Each of the mirrors, which is supported by a hinge, turns to the left or right at an angular width of ±10° in response to a signal generated from a digital board to form an image.

FIG. 1 shows a micro-mirror device as a micro-mechanical device disclosed in U.S. Pat. No. 5,331,454, entitled "Low Reset Voltage Process for DMD" and issued to Texas Instruments Incorporated (Dallas, Tex.).

In FIG. 1, when a driving voltage is applied between an address electrode 10 and a mirror 12, an electrostatic attractive force builds between the address electrode 10 and the mirror 12. The attraction between the two causes the mirror 12 to become inclined on a hinge 14, which is supported by a support layer 16. The hinge 14 twists and the edge of the inclined mirror 12 contacts or lands on a landing electrode 18 of a substrate 20. The mirror 12 may undesirably adhere to the surface of the landing electrode 18. The adhesion between the landing electrode 18 and the mirror 12 results in attractive inter-molecular forces between the two surfaces commonly referred to as Van der Waals forces. Van der Waals forces increase as the surface energy of a material increases, as the contact area between the surfaces increases, or as the contact time between the surfaces increases.

One technique to overcome the adhesion or stiction problem involves applying a voltage pulse train to the landing electrode 18. However, the amount of the applied voltage must be increased to depress an undesirable increase in the Van der Waals forces of the contacting surfaces. Finally, too much electrostatic attractive force builds between the mirror 12 and the landing electrode 18, such that the device may be damaged and possibly even causing the mirror 12 to snap off of its hinge 14.

In U.S. Pat. No. 5,331,454, powdered perfluordecanoic acid (PFDA) is deposited as a passivation material 34 on the landing electrode, as shown in FIG. 2. A method of vapor-depositing PFDA on the landing electrode 18 is disclosed in U.S. Pat. No. 5,602,671 in detail. Referring to FIG. 3, an oven 40 is preheated to 80° C. A source material 44, in this case PFDA, and a chip 46 are placed in a glass container 48. These are placed in the oven 40, which is evacuated by a valve 50 and backfilled through a valve 42 with dry $N_2$. When the PFDA reaches its melting temperature, it produces a vapor that is deposited onto the surface of the chip 46. The lid of the container 48 is removed after about 5 minutes of deposition, and the oven 40 is evacuated. Only a monolayer of PFDA is left on the chip 46. The PFDA monolayer produces beneficial effects, including a low surface energy, a low coefficient of friction, and a high wear resistance.

Although the conventional techniques discussed above are generally thought to be acceptable, they are not without shortcomings. In particular, a method of evaporating a solid source material and performing vapor deposition, as disclosed in U.S. Pat. Nos. 5,331,454 and 5,602,671, consumes valuable processing time to heat the source material, causes pollution, and requires surface activation.

Moreover, since a monolayer of PFDA having no cross link has volatility, hermetic sealing is necessary to maintain a constant sealing atmosphere within a device. This necessity results in an increase in the manufacturing cost and complex processes. In addition, the reliability of a monolayer decreases at high temperature. Since a monolayer is deposited to a thickness of several tens of angstroms through about 100 angstroms, it is impossible to adjust the thickness of the monolayer suitable to the size of a device, to improve characteristics and reliability, and to increase a life span.

SUMMARY OF THE INVENTION

To solve the above-described problems, it is a first object of the present invention to provide a micro-mechanical device having an anti-stiction layer which reduces manufacturing time and prevents pollution, and a method of manufacturing the device.

It is a second object of the present invention to provide a micro-mechanical device having an anti-stiction layer that does not need a separate cleaning or activation process and can be applied regardless of the type of substrate, and a method of manufacturing the device.

It is a third object of the present invention to provide a micro-mechanical device having an anti-stiction layer which does not require hermetic sealing, and a method of manufacturing the device.

It is a fourth object of the present invention to provide a micro-mechanical device having an anti-stiction layer in which the thickness can be freely adjusted to suit the size of the device, to improve the characteristics and reliability of the device, and to increase the life span of the device, and a method of manufacturing the device.

To achieve the above objects, in one aspect, a method of manufacturing a micro-mechanical structure comprises preparing a substrate having an insulation unit with a surface on which a predetermined circuit is provided; forming at least one electrode patterned in a predetermined shape on the substrate; forming a sacrificial layer having a hole on the surfaces of the electrode and the substrate; forming a movable structure around the hole of the sacrificial layer; completing the movable structure by removing the sacrificial layer; forming a passivation layer on the substrate having the movable structure using plasma enhanced chemical vapor deposition; and etching the passivation layer from a part of the top of the electrode and from the top of the movable structure using plasma etching.

In another aspect, a micro-mechanical structure which is manufactured by the above-described method comprises a substrate; at least one electrode formed on the substrate; at least one movable structure supported by the substrate, such that the movable structure is separated from the substrate by a predetermined distance and movable to contact the electrode; and a passivation layer provided only on (1) an entire portion of the substrate that is positioned directly opposite the moveable structure so that a part of the top of the electrode remains exposed, and (2) the entire moveable structure except for a top surface of the moveable structure.

BRIEF DESCRIPTION OF THE DRAWINGS

The above objects and advantages of the present invention will become more apparent by describing in detail illustrative, non-limiting embodiments thereof with reference to the attached drawings in which.

DETAILED DESCRIPTION OF THE INVENTION

Figure 1:
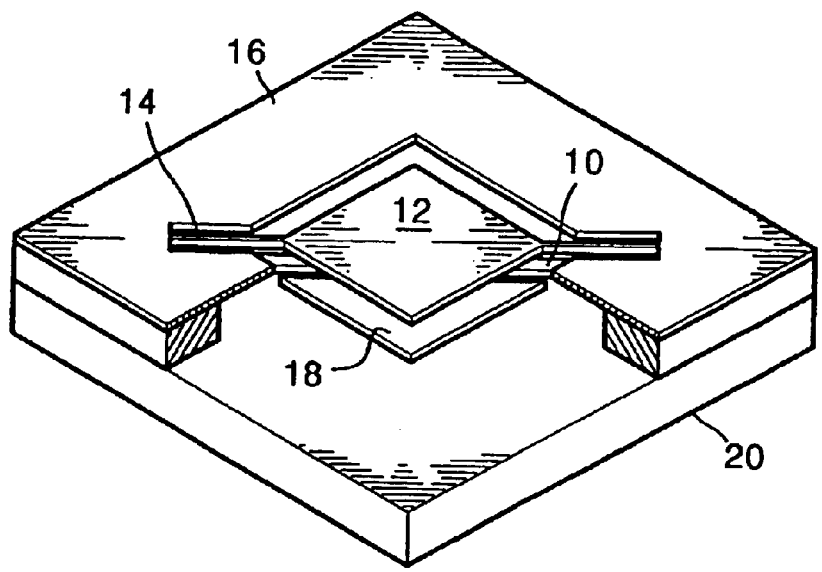
FIGS. 1 and 2 are diagrams of conventional micro-mechanical devices.
Figure 2:
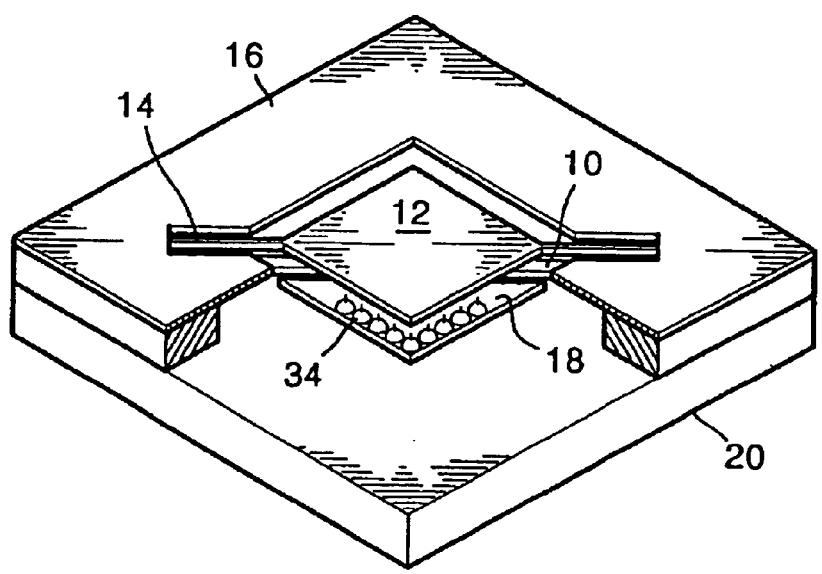
Figure 3:
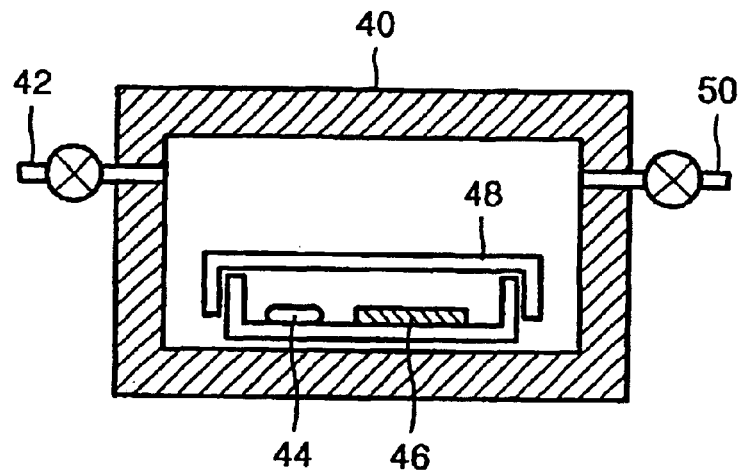
FIG. 3 is a schematic diagram of plasma vapor deposition (PVD) equipment for manufacturing a conventional micro-mechanical device.

Illustrative, non-limiting embodiments of the present invention will be described in detail with reference to the attached drawings. The present invention is not restricted to the following embodiments, and many variations are possible within the spirit and scope of the present invention. The embodiments of the present invention are provided to more completely explain the present invention to anyone skilled in the art. The drawings are provided to explain the present invention. In the drawings, the same reference numerals denote the same members.

FIGS. 4A through 4I show stages in the process of manufacturing a micro-mechanical device according to an embodiment of the present invention.

Figure 4A:
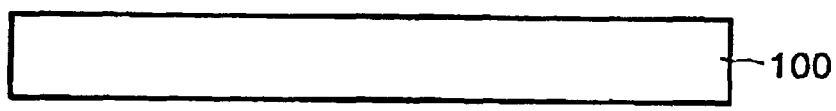
FIGS. 4A through 4I are diagrams of stages in the process of manufacturing a micro-mechanical device according to an embodiment of the present invention.
Figure 4B:
Figure 4C:
Figure 4D:
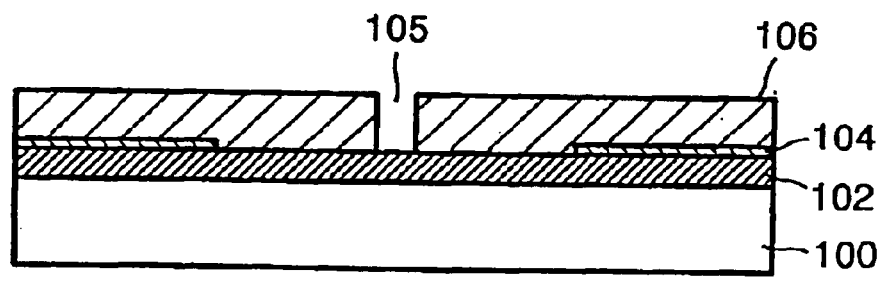
Figure 4E:
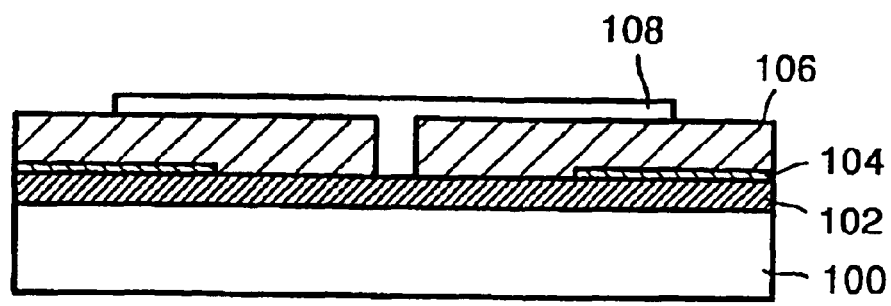

As shown in FIG. 4A, a silicon substrate 100 of a thickness of, for example, about 500–800 μm is provided. As shown in FIG. 4B, an insulation unit 102 including a circuit is formed on the substrate 100. As shown in FIG. 4C, an electrode 104 for electrically connecting the circuit to a structure is formed. As shown in FIG. 4D, a sacrificial layer 106 having a hole 105 is formed to a thickness of about 1–2 μm on the entire surface of the electrode 104 and the entire surface of the exposed insulation unit 102. As shown in FIG. 4E, a movable structure 108 is formed on the sacrificial layer 106. The process shown in FIG. 4A through FIG. 4E is referred to as wafer processing.

Figure 4F:
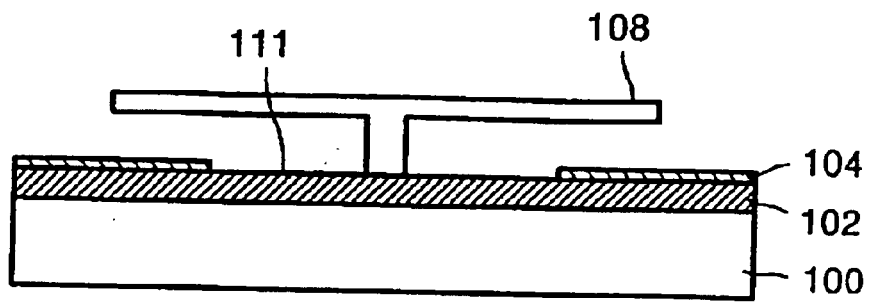

After the wafer processing, the sacrificial layer 106 is removed so that the movable structure 108 is separated from the substrate 100 and becomes movable, as shown in FIG. 4F.

Figure 4G:
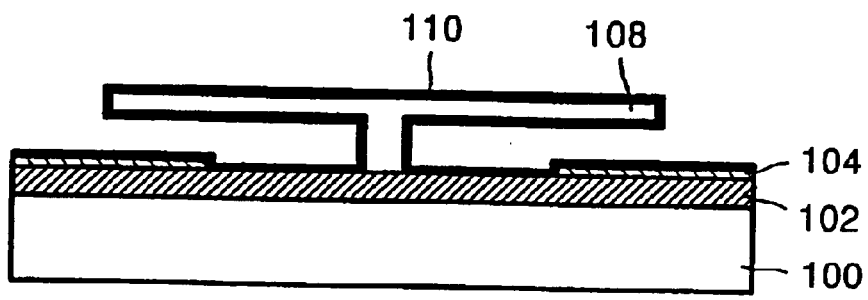
Figure 5:
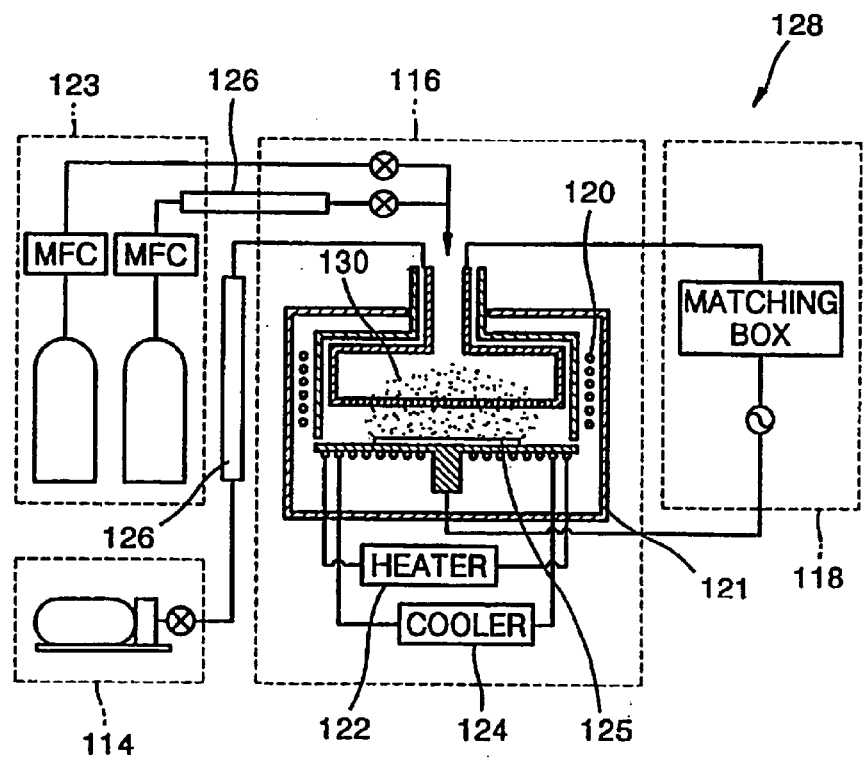
FIG. 5 is a schematic diagram of plasma enhanced chemical vapor deposition (PECVD) equipment applied to a micro-mechanical device according to the embodiment of the present invention.

After removing the sacrificial layer 106, an anti-stiction layer 110 according to the present invention is formed to a thickness of about 100–1000 Å on the entire surfaces of the movable structure 108, the electrode 104, and the exposed insulation unit 102, as shown in FIG. 4G. The deposition of the anti-stiction layer 110 is performed by a capacitively couple radio frequency (CCRF) plasma reactor 128 as shown in FIG. 5. In addition, a method such as an inductively coupled plasma (ICP) method, or an electron cyclotron resonance (ECR) method using high-density plasma, or a method of forming a layer having predetermined characteristics by generating plasma as a pulse and adjusting the duty ratio of the pulse can be considered.

The CCRF plasma reactor 128 shown in FIG. 5 includes a source supply unit 123, a vacuum pump unit 114, a chamber unit 116, and an RF generator 118. Heaters 120 are provided on both side walls of a chamber 121, heaters 122 and coolers 124 are alternately provided in a lower portion of the chamber 121, and a line heater 126 is provided at a gas pipe, so that the temperature of a substrate 125 can be independently controlled.

Fluorocarbon ($C_xF_y$), hydrocarbon ($C_xH_y$), hydrofluorocarbon ($C_xH_yF_z$), or a mixture of these gases are representative deposition gases that can be used for generating plasma. Alternatively, plasma can be generated by adding an inert gas, such as Ar, He, or $N_2$, to the deposition gas.

In the present embodiment, octafluorocyclobutane ($C_4F_8$) and argon (Ar) are used. Argon is used to stabilize and surface-activate plasma 130. Octafluorocyclobutane in which a ratio of fluorine to carbon is 2 is used because it is easily decomposed, supplies a large amount of reactant, and results in less pollution. Deposition of the anti-stiction layer 110 of FIG. 4G may be substantially performed through three stages, i.e., cleaning, deposition, and heat treatment. A cleaning process is performed to minimize a change occurring in the thickness or characteristics of a deposited thin film according to a state of the surface of the thin film. Considering a die attaching process performed after a deposition process, a heat treatment process is performed in the atmosphere.

The characteristics of the anti-stiction layer 110 vary with the deposition conditions such as process pressure, power, the partial pressure of $C_4F_8$, and substrate temperature. As a result of analyzing the influence of pressure, power, and partial pressure on plasma through tests performed changing the deposition conditions, it was concluded that the optimal conditions of deposition of the anti-stiction layer 110 were $C_4F_8$ at 4 sccm, Ar at 4 sccm, a pressure of 600 mTorr, a power of 20 Watts, a substrate temperature of 40° C., and deposition time of 1 minute. A deposition rate was about 30 nm/min under the optimal conditions.

Meanwhile, plasma enhanced chemical vapor deposition (PECVD) performs deposition using a chemical reaction unlike plasma vapor deposition (PVD). Energetic particles (electrons or ions) directly activate a surface, and reactant is deposited on the surface, so deposition is less influenced by a state of the surface. However, when plasma is generated, there is a difference in mobility between ions and electrons within the plasma, provoking negative bias toward a substrate. As a result, many ion collisions occur on the top of the movable structure 108 shown in FIG. 4F and a portion of the device located laterally beyond the range of the movable structure 108, thereby accelerating the chemical reaction on these portions. Therefore, when a thin film is deposited using plasma, the thin film is thicker on the top of the movable structure 108 and the portion that is located laterally beyond the range of the movable structure 108 than on the lower portion of the movable structure 108 and the portion that is located below the movable structure 108.

The anti-stiction layer 110, which is formed through the above processes, is necessary only for a portion of the movable structure 108. The anti-stiction layer 110 deposited on the reflecting surface (i.e., the upward facing surface in FIG. 4G) of the movable structure 108 impedes the reflection of light. For example, even in the case of a surface totally reflecting all incident light, if the anti-stiction layer 110 is deposited on the surface to a thickness of about 150 Å, a reflection loss of about 0.8% occurs. In addition, the anti-stiction layer 110 deposited on the surface of the electrode 104 increases contact resistance. Moreover, it is difficult to perform soldering on the anti-stiction layer 110 having low surface energy, so wire bonding performed during packaging is not accomplished smoothly.

Accordingly, it is not necessary to form the anti-stiction layer 110 on portions of the device other than a lower portion of the movable structure 108 and a portion that is located below the movable structure 108.

The following description concerns a typical method of selectively depositing a thin film only on a desired portion. After depositing a thin film to a desired thickness, photolithography is performed to form photoresist only on a desired portion. Next, an etching process is performed using the photoresist as an etching mask, thereby removing an unnecessary portion from the thin film. More specifically, the photoresist is deposited to a predetermined thickness on the entire surface of the deposited thin film and then is patterned by exposure and development. The patterned photoresist is used as an etching mask during an etching process so that a portion of the thin film that is not covered with the photoresist but is exposed is etched and removed. With such a method, a thin film is usually deposited selectively.

However, such a typical method of selectively depositing a thin film using photolithography can not be used for the anti-stiction layer 110. Because the anti-stiction layer 110 has hydrophobic property, it is impossible to deposit usual photoresist used for photolithography on the anti-stiction layer 110. In order to deposit photoresist on a thin film having hydrophobic property such as the anti-stiction layer 110, a surface of the thin film needs to be processed physically or chemically, thereby having hydrophilic property. During the physical or chemical process, however, the anti-stiction layer 110 may lose its native property, i.e., hydrophobic property. Consequently, the above-described typical method of selectively depositing a thin film using photolithography cannot be used for the anti-stiction layer 110.

Another method of selectively depositing a thin film is a lift-off method. In the lift-off method, photoresist is coated and patterned first, and then a thin film is deposited. Next, when the photoresist is removed, a portion of the thin film deposited on the photoresist is lifted off and removed together with the photoresist. As a result, the thin film can be patterned. The lift-off method can be easily used on a flat surface, but it is almost impossible to use the lift-off method when the anti-stiction layer 110 is deposited on the movable structure 108 that is projectively formed.

In addition, the lift-off method uses a liquid solvent to remove the photoresist. The movable structure 108 that has been formed finely may be deformed or damaged by the liquid solvent.

As described above, it is almost impossible to pattern a hydrophobic thin film such as the anti-stiction layer 110 using conventional methods without changing the property of the thin film.

The present invention does not use photolithography but uses deposition and etching processes in a sequence of deposition, etching, and deposition in a plasma state, thereby making it possible to selectively deposit the anti-stiction layer 110. This repetitive process is referred to herein as a deposition-etching-deposition (DED) process. The DED process is a process of alternately repeating deposition and etching without performing photolithography between deposition and etching.

The DED process will be described with reference to the flowcharts shown in FIGS. 6 and 7. The DED process will also be appreciated by referring to FIGS. 4E through 4I.

Figure 6:
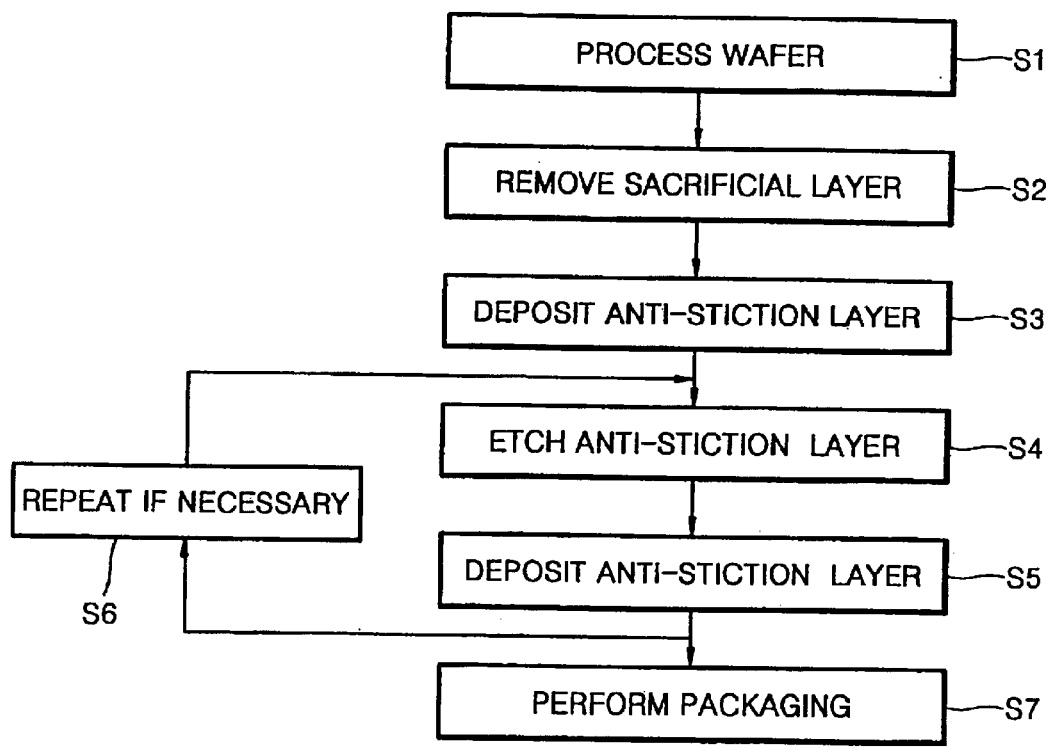
FIG. 6 is a flowchart of a method of manufacturing a micro-mechanical device according to a first embodiment of the present invention.

Turning to FIG. 6, the wafer processing described above is completed in step S1, as shown in FIG. 4E. The sacrificial layer is removed in step S2, as shown in FIG. 4F. Alternatively, before moving the sacrificial layer 106, dicing can be performed. After the sacrificial layer 106 is removed in step S2, a completed structure (referred to as the substrate 125 in FIG. 5) is placed in the plasma reactor 128 of FIG. 5 and maintained at predetermined temperature and pressure with a predetermined gas to excite plasma and deposit the anti-stiction layer 110 in step S3, as shown in FIG. 4G. After the anti-stiction layer 110 is deposited, an etching process is performed under the state in which the plasma reactor 128 is maintained in a vacuum state in step S4. The same deposition process as step S3 is performed in step S5. According to circumstances, the last deposition process S5 can be omitted, as shown in FIG. 7.

Figure 8:
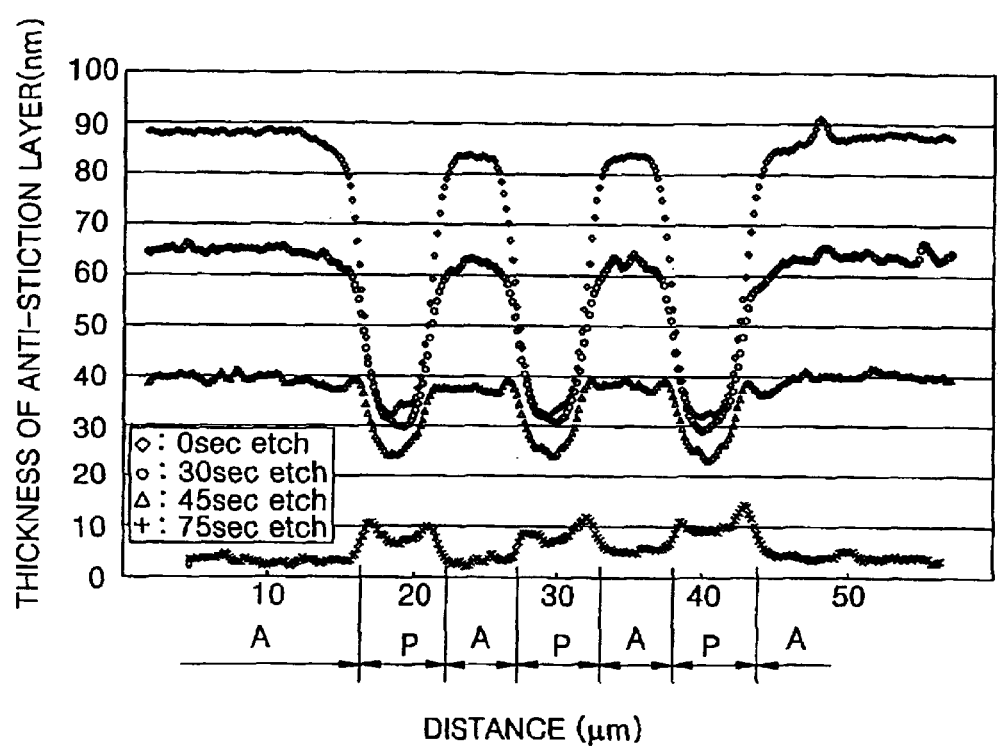
FIG. 8 is a graph showing thickness difference of an anti-stiction layer versus etching time.

Table 1 and FIG. 8 show thickness difference of an anti-stiction layer versus etching time. In Table 1, a portion P is a portion of an anti-stiction layer located below a structure, and a portion A is a portion of the anti-stiction layer formed on a top of the structure.

TABLE 1

| Etching time | 10 sec | 20 sec | 40 sec |
| --- | --- | --- | --- |
| Thickness of portion A (Å) | 383 | 300 | 179 |
| Thickness difference (Å) | 145 | 124 | 51 |
| Etch rate of portion A (Å/sec) | N/A | 8.3 | 6.8 |
| Etch rate of portion P (Å/sec) | N/A | 2.1 | 3.1 |
| Static contact angle (°) | 119.1 | 118.0 | 116.3 |

As shown in Table 1 and FIG. 8, during deposition, an anti-stiction layer is deposited thicker at the portion A formed on the top of the structure than at the portion P located below and covered with the structure. However, during etching, an etch rate of the portion A of the anti-stiction layer is remarkably higher than that of the portion P of the anti-stiction layer. Accordingly, a thickness of the portion A of the anti-stiction layer deposited on the top of the structure, which is formed of aluminum, decreases rapidly while a thickness of the portion P of the anti-stiction layer located below the aluminum structure decreases slowly. It can be inferred that a thickness difference between the portion A and the portion P of the anti-stiction layer decreases as etching time increases.

Consequently, as shown in FIG. 8, the portion A of anti-stiction layer formed on the top of the structure can be almost removed while the portion P of the anti-stiction layer located below the structure remains with a relatively greater thickness by appropriately adjusting etching time. When etching time is long, only the portion A of the anti-stiction layer can be completely removed.

In addition, it is a static contact angle that will be noted in Table 1. Referring to Table 1, the static contact angle of the anti-stiction layer rarely changes when etching time changes. Accordingly, when the DED process of the present invention is used, the anti-stiction layer can be formed only on a desired portion, and the property of the anti-stiction layer is rarely affected.

Figure 4H:
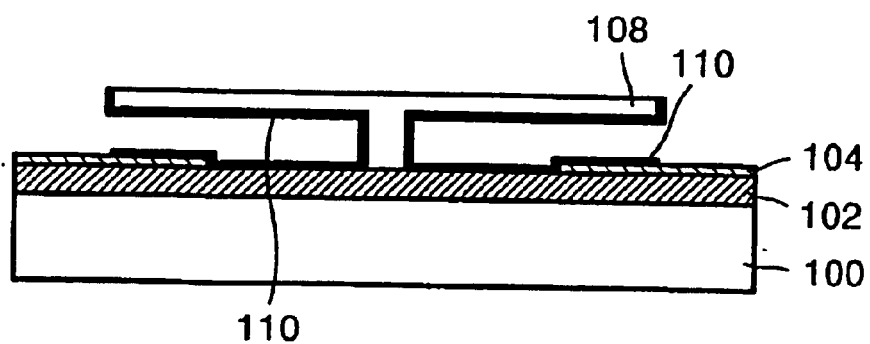
Figure 7:
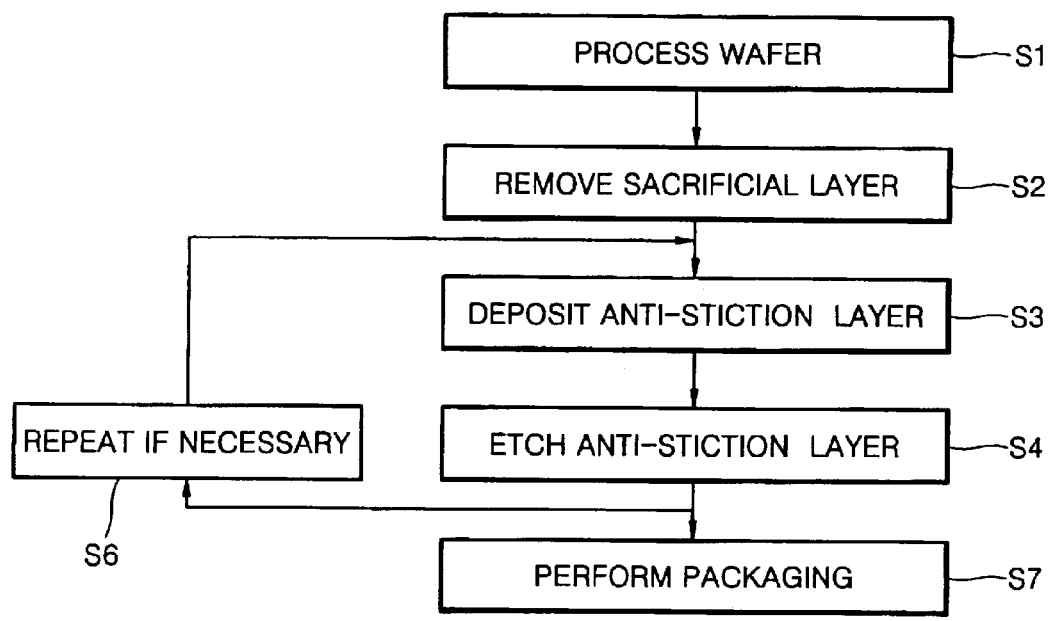
FIG. 7 is a flowchart of a method of manufacturing a micro-mechanical device according to a second embodiment of the present invention.

If necessary, as shown in FIGS. 6 and 7, the anti-stiction layer 110 can be alternately and repeatedly deposited and etched several times through step S6. In this situation, the DED process may end with a deposition process, as shown in FIG. 6, or with an etching process, as shown in FIG. 7. After completion of the anti-stiction layer 110, the heat treatment described before is performed on the substrate. FIG. 4H shows the result structure formed through steps S1 through S6 in FIG. 6 or 7.

As shown in FIG. 4H, the anti-stiction layer 110 is provided primarily on the portions of the device needing it. This is because the anti-stiction layer 110 on the top of the movable structure 108 and on the portion of the substrate 125 located beyond the range of the movable structure 108 is easily etched. However, the remaining portions of the movable structure 108 (i.e., the portions other than the top or reflecting surface), which include a contact portion needing the anti-stiction layer 110, and the portion of the substrate 125 located below the movable structure 108 are rarely etched due to the influence of the movable structure 108.

Figure 4I:
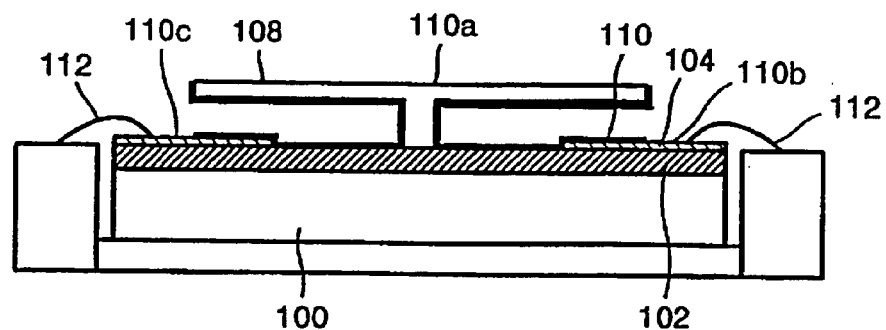

In addition, when deposition and etching are alternately repeated, the anti-stiction layer 110 is stacked several times only on a portion located below the movable structure 108, and therefore, the anti-stiction layer 110 having a sufficient thickness is formed below the movable structure 108. When the DED process ends with an etching process, the anti-stiction layer 110 rarely remains on the top of the movable structure 108 and on the portion of the substrate 125 located beyond the range of the movable structure 108. In other words, as shown in FIG. 4I (which shows the result of completing a packaging process in step S7 of FIG. 6 or 7), the anti-stiction layer 110 may be etched so that it does not exist on (1) the electrode portions 110b and 110c that are subsequently bonded to wires 112 for electrical connections, and (2) a surface 110a of the movable structure 108, which is used as a reflector.

When the DED process ends with a deposition process, the anti-stiction layer 110 may also remain on the top of the movable structure 108, but the anti-stiction layer 110 on the top of the movable structure 108 can be controlled to be sufficiently thin not to degrade light reflectivity. When the DED process ends with a deposition process, advantageously, the surface of the anti-stiction layer 110 than may have been damaged during etching can be restored.

According to the present invention, reactant is deposited on the surface of a substrate while electrons or ions are directly activating the substrate surface in a plasma state, so the processes of cleaning and activating the substrate surface are not necessary. The present invention can be applied to any kind of substrate. For example, an anti-stiction layer according to the present invention can be deposited on any surface when a substrate is formed of silicon oxide and a movable structure is formed of aluminum or when the substrate is formed of silicon and metal.

In addition, since all processes are performed in vacuum equipment and by-products are discharged into a vacuum during deposition, no residual substance is left, thereby realizing a clean process, unlike a conventional technique using a solid source that causes pollution. This feature of the present invention is particularly advantageous when it is applied to micro-mechanical structures, which are fatally vulnerable to particles.

Also, the present invention can be practiced using safe processes in terms of the human body and environment by using $C_xF_y$ as a precursor for PECVD.

Moreover, in the case of PECVD, since all processes are performed within vacuum equipment and without consuming time for heating of a source and movement, manufacturing time can be remarkably reduced.

Since a small amount of source gas can be controlled using, for example, a mass flow controller, the present invention consumes a smaller amount of source gas than conventional PVD or deposition using solution immersion, thereby enabling a micro-mechanical device to be manufactured at 10% of the conventional manufacturing cost.

The present invention enables the thickness of an anti-stiction layer to be controlled at specific positions of the device by alternately performing etching and deposition, thereby decreasing the thickness of the anti-stiction layer as much as possible on a portion which does not positively need deposition of the anti-stiction layer and increasing the thickness of the anti-stiction layer on a portion, for example, a contact portion, needing the anti-stiction layer for increasing the reliability and life span of the device. In particular, the present invention allows selective deposition of the anti-stiction layer having hydrophobic property, which is impossible with conventional deposition.

This invention has been particularly shown and described with reference to illustrative, non-limiting embodiments. It will be understood by those skilled in the art that various changes in form and details may be made without departing from the spirit and scope of the invention as defined by the appended claims.

What is claimed is:

1. A method of manufacturing a micro-mechanical structure, comprising the steps of:

preparing a substrate having an insulation unit with a surface on which a predetermined circuit is provided;

forming at least one electrode patterned in a predetermined shape on the substrate;

forming a sacrificial layer having a hole on the surfaces of the electrode and the substrate;

forming a movable structure around the hole of the sacrificial layer;

completing the movable structure by removing the sacrificial layer;

forming a passivation layer on the substrate having the movable structure using plasma enhanced chemical vapor deposition; and etching the passivation layer from a part of the top of the electrode and from the top of the movable structure using plasma etching.

2. The method of claim 1, wherein the passivation layer is removed without using photolithography which uses photoresist.

3. The method of claim 1, wherein the passivation layer is formed by one of (1) repetition of deposition followed by etching, and (2) repetition of deposition followed by etching followed by deposition.

4. The method of claim 3, wherein the passivation layer is removed from the part of the top of the electrode and the top of the movable structure during the repetition of deposition followed by etching and provided only on (1) an entire portion of the substrate that is positioned directly opposite the moveable structure so that a part of the top of the electrode remains exposed, and (2) the entire moveable structure except for a top surface of the moveable structure.

5. The method of claim 3, wherein the passivation layer is formed by the repetition of deposition followed by etching followed by deposition so that a thickness of the passivation layer formed on the part of the top of the electrode and on the top of the movable structure is less than a thickness of the passivation layer formed on the other portions.

6. The method of claim 1, further comprising the step of packaging the micro-mechanical structure.

7. The method of claim 1, wherein the passivation layer is an anti-stiction layer formed of at least one selected from the group consisting of a fluorocarbon polymer, a hydrocarbon polymer, and a hydrofluorocarbon polymer.

8. A micro-mechanical structure which is manufactured by the method of claim 1, the micro-mechanical structure comprising;
    a substrate;
    at least one electrode formed on the substrate;
    at least one movable structure supported by the substrate, such that the movable structure is separated from the substrate by a predetermined distance and movable to contact the electrode; and
    a passivation layer provided only on (1) an entire portion of the substrate that is positioned directly opposite the moveable structure so that a part of the top of the electrode remains exposed, and (2) the entire moveable structure except for a top surface of the moveable structure.

* * * * *